US010211782B1

United States Patent
Banerjee et al.

(10) Patent No.: US 10,211,782 B1
(45) Date of Patent: Feb. 19, 2019

(54) LOW-POWER WIDE-SWING SENSE AMPLIFIER WITH DYNAMIC OUTPUT STAGE BIASING

(71) Applicant: QUALCOMM Incorporated, San Diego, CA (US)

(72) Inventors: Anirban Banerjee, Cary, NC (US); Todd Morgan Rasmus, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/785,294

(22) Filed: Oct. 16, 2017

(51) Int. Cl.
*H03F 1/02* (2006.01)
*H03F 3/45* (2006.01)
*H03L 7/089* (2006.01)

(52) U.S. Cl.
CPC .......... *H03F 1/0205* (2013.01); *H03F 3/4521* (2013.01); *H03F 3/45273* (2013.01); *H03L 7/0891* (2013.01); *H03F 2203/45112* (2013.01)

(58) Field of Classification Search
CPC ............... H03F 3/4521; H03F 3/45273; H03F 2203/45112; H03F 1/0205
See application file for complete search history.

(56) References Cited

U.S. PATENT DOCUMENTS

| | | | | |
|---|---|---|---|---|
| 5,574,401 | A * | 11/1996 | Spitalny | H03F 3/3023 330/253 |
| 5,650,753 | A * | 7/1997 | Ling | H03F 1/3217 330/253 |
| 5,714,906 | A * | 2/1998 | Motamed | H03F 3/3023 327/563 |
| 5,831,480 | A * | 11/1998 | Kato | H03F 3/3027 330/253 |
| 5,990,742 | A * | 11/1999 | Suzuki | H03F 3/3001 330/253 |
| 6,445,250 | B1 | 9/2002 | Aude | |
| 6,970,043 | B2 | 11/2005 | Pradhan et al. | |
| 7,183,852 | B2 * | 2/2007 | Abe | H03F 3/4521 330/253 |
| 7,400,173 | B1 | 7/2008 | Kwong et al. | |
| 7,443,239 | B2 | 10/2008 | Tsuchi et al. | |
| 8,625,373 | B2 | 1/2014 | Schreiber | |
| 2004/0000949 | A1 * | 1/2004 | Tsuchi | H03F 3/4521 330/253 |
| 2005/0093629 | A1 * | 5/2005 | Nishimura | H03F 3/45183 330/253 |
| 2008/0007367 | A1 * | 1/2008 | Kim | H03B 5/04 331/36 C |

(Continued)

OTHER PUBLICATIONS

Degrauwe M.G., et al., "Adaptive Biasing CMOS Amplifiers," IEEE Journal of Solid-State Circuits, Jun. 1982, vol. SC-17, No. 3, pp. 522-528.

(Continued)

*Primary Examiner* — Thomas J. Hiltunen
(74) *Attorney, Agent, or Firm* — Haynes and Boone, LLP (57) ABSTRACT

A rail-to-rail sense amplifier includes a PMOS differential pair and an NMOS differential pair that are arranged in parallel with regard to a biasing network for driving a class AB output stage. The sense amplifier includes a first current differential amplifier and a second current differential amplifier for increasing the output swing while reducing power consumption.

17 Claims, 5 Drawing Sheets

(56) References Cited

U.S. PATENT DOCUMENTS

2008/0079491 A1* 4/2008 Yuasa .................. H03F 3/3022
330/253
2012/0249247 A1* 10/2012 Hsu ..................... H03F 3/45179
330/297

OTHER PUBLICATIONS

Torfifard J., et al., "A Power-Efficient CMOS Adaptive Biasing Operational Transconductance Amplifier," ETRI Journal, Apr. 2013, vol. 35, No. 2, pp. 226-233.
You F., et al., "Low-Voltage Class AB Buffers with Quiescent Current Control," IEEE Journal of Solid-State Circuits, Jun. 1998, vol. 33, No. 6, pp. 915-920.

* cited by examiner

LOW-POWER WIDE-SWING SENSE AMPLIFIER WITH DYNAMIC OUTPUT STAGE BIASING

TECHNICAL FIELD

This application relates to a wide-swing sense amplifier, and more particularly to a low-power wide-swing sense amplifier with dynamic output stage biasing.

BACKGROUND

An analog phase-locked loop (PLL) includes a charge pump that is driven by a phase detector with up and down signals. The charge pump typically includes a PMOS switch transistor that switches on responsive to an assertion of the up signal so that a PMOS current source transistor sources a current through the PMOS switch transistor to charge a control voltage at a drain terminal of the PMOS switch transistor. Such a charge pump will also include an NMOS switch transistor that switches on responsive to an assertion of the down signal so that an NMOS current source transistor sinks a current through the NMOS switch transistor to discharge the control voltage since a drain terminal for the NMOS switch transistor is connected to the drain terminal for the PMOS switch transistor. When the PMOS switch transistor is not switched on because the up signal is not asserted, a drain terminal for the PMOS current source transistor is charged to a power supply voltage. Conversely, when the NMOS switch transistor is not switched on because the down signal is not asserted, a drain terminal for the NMOS current source transistor drain is discharged. These charged drain terminals for the current source transistors then engage in charge sharing with a loop filter for the PLL when their switch transistors are switched on. The resulting charge sharing disturbs the control voltage and lowers the PLL performance.

To mitigate such charge sharing, it is conventional to keep the drain terminal voltages for the current source transistors charged to the control voltage by arranging the switch transistors in parallel with duplicate switch transistors that are driven by a complement of the corresponding up or down signals. It thus doesn't matter whether the up or down signal is asserted since either the original switch transistor or its duplicate will always be on. An operational amplifier (op-amp) maintains the drains of the duplicate PMOS and NMOS switch transistors to equal the control voltage so that the loop filter is not affected by charge sharing. But high-speed operation of a PLL results in a wide swing for the control voltage such that it may range rail to rail (from ground to the power supply voltage). The resulting op-amp must then also be wide swing. In addition, the op-amp must be able to source or sink a relatively large current to adequately support the PLL operation. But conventional op-amps such as a class AB operational amplifier 100 (which may also be denoted as a sense amplifier 100) shown in FIG. 1 have difficultly satisfying such output current and wide swing demands. As is known in the wide-swing sense amplifier arts, sense amplifier 100 includes not only a PMOS differential pair of transistors P1 and P2 but also an NMOS differential pair of transistors M1 and M2. A differential input voltage formed by the difference between an input voltage inp and an input voltage inn drives the two complementary differential pairs of transistors. In particular, input voltage inp drives the gates of transistors P1 and M1 whereas input voltage inn drives the gates of transistors P2 and M2. A current source 105 biases the sources of transistors P1 and P2. Similarly, a current source 125 biases the sources of transistors M1 and M2.

Figure 1:
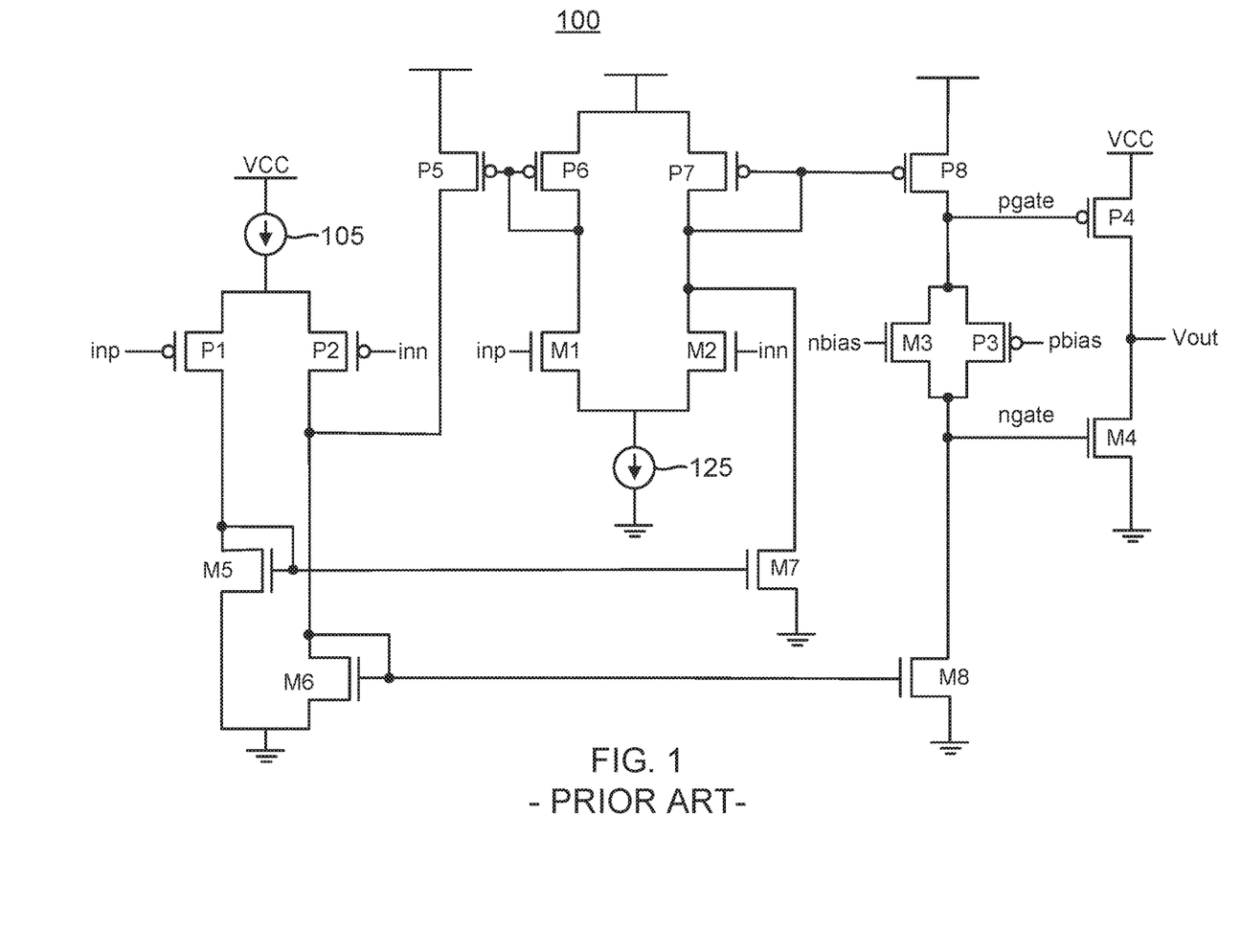
FIG. 1 is a circuit diagram of a conventional wide-swing sense amplifier.

A class AB output stage for sense amplifier 100 is formed by a PMOS output transistor P4 and an NMOS output transistor M4. A biasing network responds to the currents in the differential pairs to drive the gate of output transistor P4 with a pgate drive voltage and to drive the gate of output transistor M4 with an ngate drive voltage. In particular, the biasing network includes a diode-connected PMOS transistor P6 coupled between a power supply node for the power supply voltage VCC and the drain of differential pair transistor M1. The gate (and drain) of diode-connected transistor P6 connects to the gate of a PMOS transistor P5 having its source tied to the power supply node and a drain connected to the drain of differential pair transistor P2. Diode-connected transistor P6 and transistor P5 thus form a current mirror so that transistor P5 conducts a mirrored-version of the current conducted by differential pair transistor M1. An NMOS diode-connected transistor M6 couples between the drain of differential pair transistor P2 and ground. Diode-connected transistor M6 thus conducts a sum current that equals a sum of the currents conducted by differential pair transistors M1 and P2. Diode-connected transistor M6 forms a current mirror with an NMOS transistor M8 having its source tied to ground and a drain tied to an ngate node at the gate of output transistor M4. Transistor M8 will thus sink a mirrored version of the sum current conducted by diode-connected transistor P6 from the ngate node for transistor M4, which causes a discharge of the ngate drive voltage.

The biasing network includes analogous circuitry to source a sum current to the gate of output transistor P4 to charge the pgate drive voltage. In particular, the drain of differential pair transistor P1 couples to ground through an NMOS diode-connected transistor M5 that forms a current mirror with an NMOS transistor M7 having its source tied to ground and a drain tied to the drain of differential pair transistor M2. The drain of differential pair transistor M2 couples to the power supply node through a PMOS diode-connected transistor P7. Diode-connected transistor P7 will thus conduct a sum current equaling the sum of the currents conducted by differential pair transistors P1 and M2. Diode-connected transistor P7 forms a current mirror with a PMOS transistor P8 having its source tied to the power supply node and its drain tied to the pgate node at the gate of output transistor P4. Transistor P8 will thus source a mirrored-version of the sum current conducted by diode-connected transistor P7 into the gate of output transistor P4 to charge the pgate drive voltage.

The wide swing or rail-to-rail performance is given by the complementary differential pairs. For example, as the common mode for input voltages inp and inn rises toward the power supply voltage, the PMOS differential pair of transistors P1 and P2 switch off. The feedback through sense amplifier 100 causes the ngate drive voltage to discharge such that output transistor M4 is switched off. The biasing network also includes a PMOS transistor P3 and an NMOS transistor M3 coupled in parallel between the gates of output transistors P4 and M4. Transistor M3 is biased by a bias voltage nbias such that it switches on as the ngate drive voltage is discharged to also discharge the pgate drive voltage. This discharge of the pgate drive voltage switches on output transistor P4 so that an output voltage (Vout) at the drains of output transistors P4 and M4 may be charged towards the power supply voltage VCC. But due to offsets in the differential pair of transistors M1 and M2, the pgate drive voltage cannot be pulled sufficiently low enough to fully drive output transistor P4 in the deep triode region as the output voltage approaches the power supply voltage VCC. A similar offset in the differential pair of transistors P1 and P2 affects the output voltage when the common mode for input voltages inp and inn is discharged. In that case, differential pair transistors M1 and M2 are switched off. Feedback through sense amplifier 100 then charges the pgate drive voltage towards the power supply voltage. Transistor P3 is biased by a bias voltage pbias such that it switches on to charge the ngate drive voltage ngate as the pgate drive voltage is charged. The output transistor M4 is thus switched on while output transistor P4 is switched off to discharge the output voltage. But again due to an offset voltage between differential pair transistors P1 and P2, the ngate drive voltage cannot be driven sufficiently high enough to fully drive output transistor M4 on in the deep triode region. It is thus conventional to oversize output transistors M4 and P4 so that they can conduct the required amount of currents at these corner conditions. The quiescent current consumption is then increased, which hampers low power operation.

Accordingly, there is a need in the art for wide swing sense amplifiers with reduced power consumption.

SUMMARY

A wide-swing sense amplifier is provided with a first current differential amplifier for an NMOS differential pair of transistors and with a second current differential amplifier for a PMOS differential pair of transistors. The first current differential amplifier sinks a first difference current from a gate of a PMOS output transistor while a common mode for a differential input voltage is charged towards the power supply voltage to enhance the response to such a high common mode value. The first difference current is proportional to a difference between a first current through a first one of the NMOS transistors in the NMOS differential pair and a second current through a second one of the NMOS transistors in the NMOS differential pair. Similarly, the second current differential amplifier sources a second difference current to a gate of an NMOS output transistor while the common mode is discharged towards ground. The second difference current is proportional to a difference between a third current through a first one of the PMOS transistors in the PMOS differential pair and a fourth current through a second one of the PMOS transistors in the PMOS differential pair. The PMOS output transistor and the NMOS output transistor are arranged in series in an amplifier output stage to produce an output voltage at their drains.

The first and second current differential amplifiers enhance the ability of the wide-swing sense amplifier to drive the output voltage towards either rail (the power supply voltage or ground) while sourcing or sinking a desired amount of current. In this fashion, low power operation is improved since the PMOS and NMOS output transistors need not be oversized to conduct a sufficient amount of current yet rail to rail performance is improved.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A sense amplifier is provided with complementary differential pairs of transistors (a PMOS pair and an NMOS pair) arranged in parallel between a dynamically-adjusted biasing network and an amplifier output stage to have reduced power consumption yet have wide swing for its output voltage. As a common mode for a differential input voltage driving the gates of the transistors in the differential pairs is charged toward a power supply voltage, the differential pair of PMOS transistors becomes inactive such that only the differential pair of NMOS transistors conducts current to discharge a gate of a PMOS output transistor in the amplifier output stage through the biasing network. The biasing network includes a first current differential amplifier that amplifies a difference between the drain currents conducted by the differential pair of NMOS transistors. The amplified difference current from the first current differential amplifier sinks from the gate of the PMOS output transistor through a pair of NMOS switch transistors controlled by the differential input voltage to assist the discharge of the gate of the PMOS output transistor. The resulting sense amplifier may thus source sufficient current through the PMOS output transistor despite an output voltage at the drain of the PMOS output transistor being charged towards the power supply voltage.

Similarly, as a common mode for the differential input voltage is discharged towards ground, the differential pair of NMOS transistors becomes inactive such that only the differential pair of PMOS transistors conducts current to charge a gate of an NMOS output transistor in the output stage (e.g., a class AB output stage) through the biasing network. The biasing network includes a second current differential amplifier that amplifies a difference between the drain currents conducted by the differential pair of PMOS transistors. The amplified difference current from the second current differential amplifier sources to the gate of the NMOS output transistor through a pair of PMOS switch transistors controlled by the differential input voltage to assist the charging of the gate of the NMOS output transistor. The sense amplifier may thus sink sufficient current through the NMOS output transistor despite an output voltage at the drain of the NMOS output transistor being discharged towards ground. The output voltage may thus be wide swing (from ground to the power supply voltage) yet the output transistors need not be oversized so as to conduct a sufficient amount of current at these corner conditions.

Figure 2A:
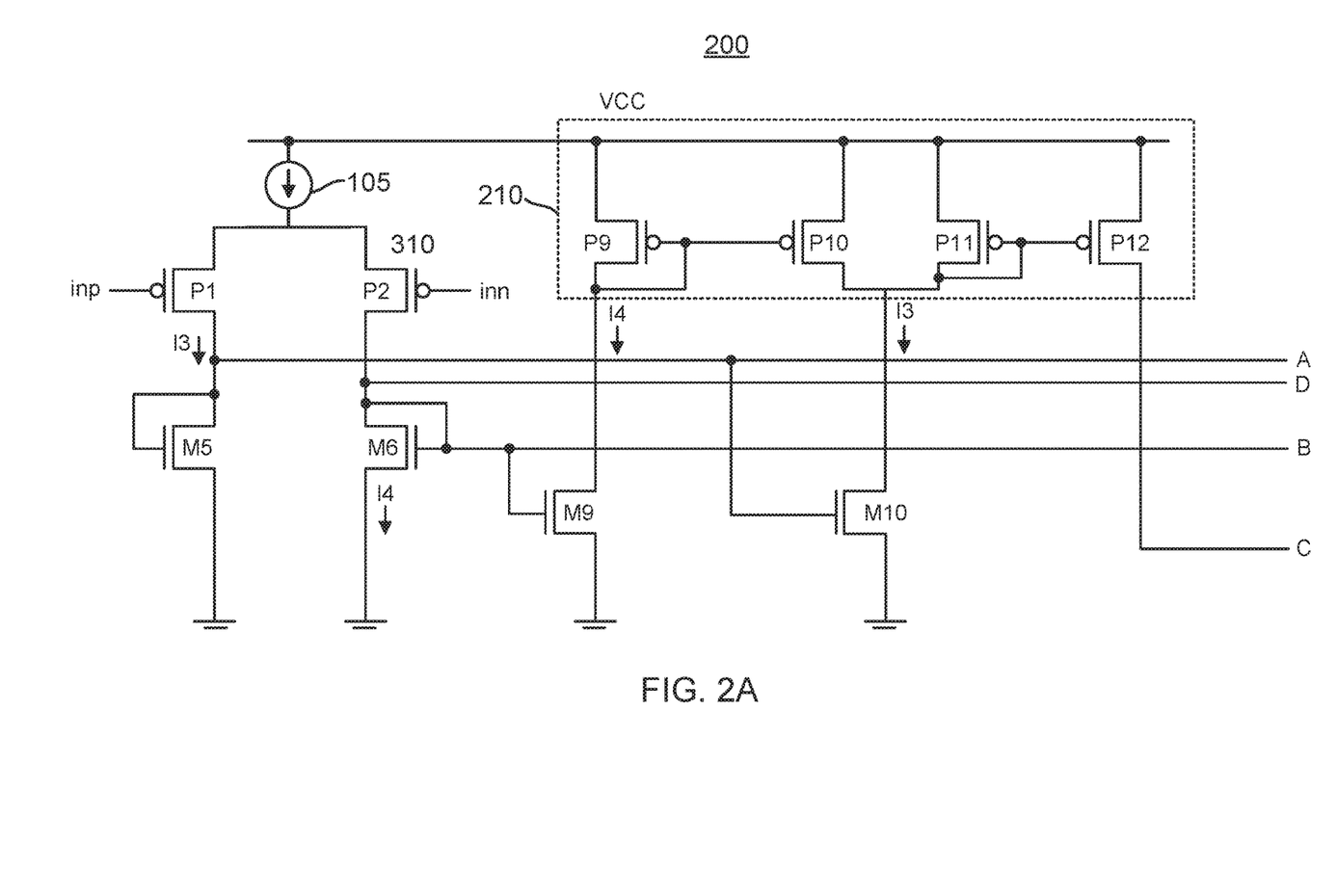
FIG. 2A and FIG. 2B illustrate a wide-swing sense amplifier in accordance with an aspect of the disclosure.
Figure 2B:
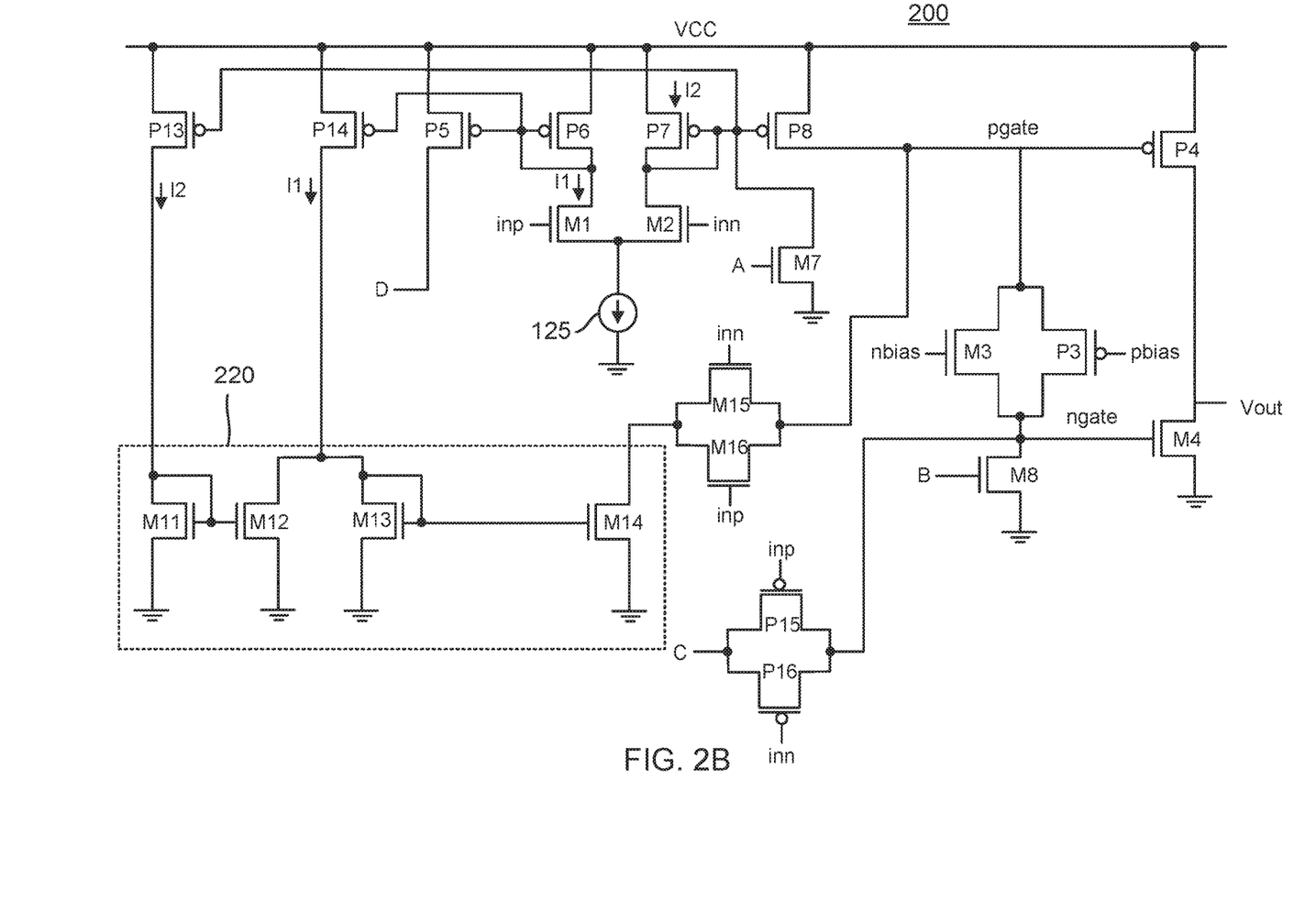

An example sense amplifier 200 is shown in FIG. 2A and in FIG. 2B. The connections between FIGS. 2A and 2B are indicated by nodes A, B, C, and D. As discussed with regard to conventional sense amplifier 100, sense amplifier 200 includes the PMOS differential pair of transistors P1 and P2 and the NMOS differential pair of transistors M1 and M2. The differential input voltage inp and inn drives the gates for the two complementary differential pairs of transistors. In particular, input voltage inp drives the gates of differential pair transistors P1 and M1 whereas input voltage inn drives the gates of differential pair transistors P2 and M2. Current source 105 biases the sources of differential pair transistors P1 and P2. Similarly, current source 125 biases the sources of differential pair transistors M1 and M2.

As also discussed with regard to sense amplifier 100, the class AB output stage for sense amplifier 200 is formed by a PMOS output transistor P4 and an NMOS output transistor M4. A biasing network for biasing output transistors P4 and M4 in response to the currents in the differential pair transistors includes diode-connected PMOS transistor P6 coupled between a power supply node for the power supply voltage VCC and the drain of differential pair transistor M1. The gate (and drain) of diode-connected transistor P6 connects to the gate of PMOS transistor P5 having its source tied to the power supply node and a drain connected to the drain of differential pair transistor P2. Diode-connected transistor P6 and transistor P5 thus form a current mirror so that transistor P5 conducts a mirrored-version of the current conducted by differential pair transistor M1. NMOS diode-connected transistor M6 couples between the drain of differential pair transistor P2 and ground. Diode-connected transistor M6 thus conducts a sum current that equals or is proportional to a sum of the currents conducted by differential pair transistors M1 and P2. Diode-connected transistor M6 forms a current mirror with NMOS transistor M8 having its source tied to ground and a drain tied to the gate of output transistor M4. Transistor M8 will thus sink a mirrored version of the sum current conducted by diode-connected transistor M6 from the ngate node at the gate of transistor M4, which causes a discharge of the ngate drive voltage.

The biasing network includes analogous circuitry to source a sum current to the gate of output transistor P4 to charge the pgate drive voltage. In particular, the drain of differential pair transistor P1 couples to ground through NMOS diode-connected transistor M5 that forms a current mirror with NMOS transistor M7 having its source tied to ground and a drain tied to the drain of differential pair transistor M2. The drain of differential pair transistor M2 couples to the power supply node through PMOS diode-connected transistor P7. Diode-connected transistor P7 will thus conduct a sum current equaling the sum of the currents conducted by differential pair transistors P1 and M2. Diode-connected transistor P7 forms a current mirror with PMOS transistor P8 having its source tied to the power supply node and drain tied to the gate of output transistor P4. Transistor P8 will thus source a mirrored-version of the sum current conducted by diode-connected transistor P7 into the pgate node at the gate of output transistor P4 to charge the pgate drive voltage. Transistors M3 and P3 couple in parallel between the gates of output transistors P4 and M4 as discussed above. Transistors M3, P3, M5, M6, P5, P6, P7, M7, P8, M9 may be deemed to form a means for biasing the gate voltage for the NMOS output transistor M4 responsive to a sum of the currents in the differential pair transistors P2 and M1 and for biasing a gate voltage for the PMOS output transistor responsive to a sum of the currents in the differential pair transistors P1 and M2.

Should the common mode for the input voltages inp and inn rise above a first threshold voltage toward the power supply voltage, differential pair transistors P1 and P2 substantially switch off such that the sum circuit conducted by diode-connected transistor M6 equals just the drain current I1 conducted by differential pair transistor M1. Transistor M8 thus drains a mirrored version of current I1 from the node for the ngate drive voltage such that it discharges towards ground. The discharge of the ngate drive voltage switches off output transistor M4 and lowers the source of transistor M3 with regard to the nbias voltage on its gate so that transistor M3 switches on to pull the pgate drive voltage low as well. To assist the discharge of the pgate drive voltage, sense amplifier 200 includes a first current differential amplifier 220 that amplifies a difference between the drain currents I1 and I2 for differential pair transistors M1 and M2, respectively.

As will be explained further herein, the input voltage inp for sense amplifier 200 may be the control voltage (Vctrl) for a PLL's charge pump. In such an embodiment, the output voltage (Vout) for sense amplifier 200 would also be the input voltage inn. As discussed earlier, the control voltage for a high speed PLL may range from rail to rail (from ground to the power supply). But a conventional sense amplifier such as sense amplifier 100 cannot push the output voltage Vout rail to rail while conducting the desired amount of current without oversizing output transistors P4 and M4 and thus increasing the power consumption. Differential input voltage inp will thus always be more positive than differential input voltage inn as the common mode for the differential input voltage rises towards the power supply voltage such that current I1 will be greater than current I2 at this corner condition. First current differential amplifier 220 is thus configured to only amplify the difference between currents I1 and I2 should I1 be bigger than I2.

First current differential amplifier 220 amplifies the difference between currents I1 and I2 and sinks the resulting current from the node for the pgate drive voltage. The output current from first current differential amplifier 220 is gated by a parallel combination of an NMOS transistor M15 and an NMOS transistor M16 that have their gates driven by the input voltages inn and inp, respectively. Transistors M15 and M16 thus act as switches that are switched on should the common mode for input voltages inp and inn rise towards the power supply voltage. The resulting sinking of the amplified difference current from the node for the pgate drive voltage is quite advantageous as the pgate drive voltage may then be further reduced as the common mode voltage rises towards the supply rail. Output transistor P4 may then be more fully switched on in the deep triode mode of operation as its drain voltage rises towards the power supply voltage (VCC) at its source. In this fashion, sense amplifier 200 may source sufficient current through output transistor P4 at the power supply corner condition (Vout being charged nearly to the power supply voltage).

Sense amplifier 200 has an analogous second current differential amplifier 210 that functions at the ground corner condition (the output voltage Vout at the drains of output transistors P4 and N4 being discharged below a second threshold voltage nearly to ground) responsive to the common mode for input voltages inp and inn being discharged towards ground. As the common mode drops towards ground, the output voltage Vout will be higher than the common mode due to the offsets within sense amplifier 200. Second current differential amplifier 210 addresses this problem by reducing the difference between the control voltage (inp) and the output voltage. Second current differential amplifier 210 thus amplifies the difference between currents I3 and I4 only when current I3 is greater than current I4 to source the resulting amplified difference current into the ngate node for the ngate drive voltage. The resulting increase in the ngate drive voltage provides sufficient drive for output transistor M4 to sink the desired amount of current as the output voltage Vout drops towards ground and forces output transistor M4 into the deep triode region of operation. Transistors P4 and M4 thus need not be oversized yet sense amplifier 200 conducts a sufficient amount of current at the corner conditions so that low power operation is enhanced. Additional circuit details for first current differential amplifier 220 and second current differential amplifier 210 will now be discussed.

Second current differential amplifier 210 includes a diode-connected PMOS transistor P9 having a source tied to the power supply node and a drain connected to a drain of a current mirror NMOS transistor M9 that mirrors the sum current I4 conducted by diode-connected transistor M6. Diode-connected transistor P9 thus conducts a mirrored version of the sum current I4. In addition, diode-connected transistor P9 forms a current mirror with a PMOS transistor P10 whose source is tied to the power supply node and whose drain is connected to the drain of an NMOS transistor M10. Transistor M10 has its gate connected to the gate/drain of diode-connected transistor M5 and thus mirrors the current I3 conducted by differential pair transistor P1. The drain of transistor M10 also connects to a drain of a PMOS diode-connected transistor P11 that forms a current mirror with a PMOS transistor P12. The sources of diode-connected transistor P11 and transistor P12 are tied to the power supply node. Since transistor P10 mirrors the current I4 whereas transistor M10 mirrors the current I3, only the difference current (I3–I4) is conducted by diode-connected transistor P11 when current I3 is greater than current I4. Should current I3 be less than current I4, diode-connected transistor P11 does not conduct. Transistor P12 may be several times larger than diode-connected transistor P11 so that the mirrored current that transistor P12 conducts is an amplified version of the difference current (I3–I4). In other embodiments, transistor P12 may be the same size as diode-connected transistor P11 such that the difference current (I3–I4) is not amplified by transistor P12. When the common mode of the differential input voltage is sufficiently low, differential pair transistors M1 and M2 are not conducting. The sum current I4 then becomes equal to the drain current for differential pair transistor P2 such that the current difference (I3–I4) is the difference between the current conducted by differential pair transistor P1 and the current conducted by differential pair transistor P2. This difference current mirrored by transistor P12 flows through a pair of PMOS switch transistors P15 and P16 arranged in parallel. Input voltage inp drives the gate of switch transistor P15 whereas input voltage inn drives the gate of switch transistor P16. Switch transistors P15 and P16 will thus be switched on when the common mode voltage is sufficiently low to boost the charging of the ngate drive voltage so that output transistor M4 can conduct the desired amount of current despite operating in the deep triode region of operation as the output voltage is discharged.

Should the common mode for input voltages inn and inp rise towards the power supply voltage (VCC), the differential pair transistors P1 and P2 will stop conducting such that the sum current I2 conducted by diode-connected transistor P7 equals the current conducted by differential pair transistor M2. Diode-connected transistor P7 is in a current mirror configuration with a PMOS transistor P13 having a source tied to the power supply node. Transistor P13 will thus conduct a mirrored version of sum current I2. First current differential amplifier 220 includes a diode-connected transistor M11 having a source tied to ground and a drain connected to the drain for transistor P13. Transistor M11 has its gate and drain connected to the gate of an NMOS transistor M12 having its source tied to ground so that diode-connected transistor M11 and transistor M12 form a current mirror. Transistor M12 thus conducts a mirrored-version of the sum current I2.

To mirror the current I1 conducted by differential pair transistor M1 into first current differential amplifier 220, the gate and drain of diode-connected transistor P6 are tied to the gate of a PMOS transistor P14 having its source tied to the power supply node. The drain of transistor P14 is tied to the drain of transistor M12 and also to the drain of an NMOS diode-connected transistor M13 having its source tied to ground. Diode-connected transistor M13 thus conducts the difference current (I1–I2) when current I1 is greater than current I2. Diode-connected transistor M13 forms a current mirror with an NMOS transistor M14 having its source tied to ground. Transistor M14 may be larger than diode-connected transistor so that transistor M14 conducts an amplified version of the difference current (I1–I2). In alternative embodiments, transistor M14 may be the same size as diode-connected transistor M13. The drain of transistor M14 couples to the pgate node through NMOS switch transistors M15 and M16 as discussed earlier. Switch transistors M15 and M16 will thus be conducting when the common mode for the differential input voltage is sufficiently high so that the amplified version of the difference current (I1–I2) may sink from the pgate node to assist in the discharge of the pgate drive voltage so that output transistor P4 may conduct a sufficient amount of current as the output voltage Vout rises towards the power supply voltage VCC. In this fashion, output transistor P4 may source the desired amount of current yet does not need to be oversized such that low power operation is achieved.

Figure 3:
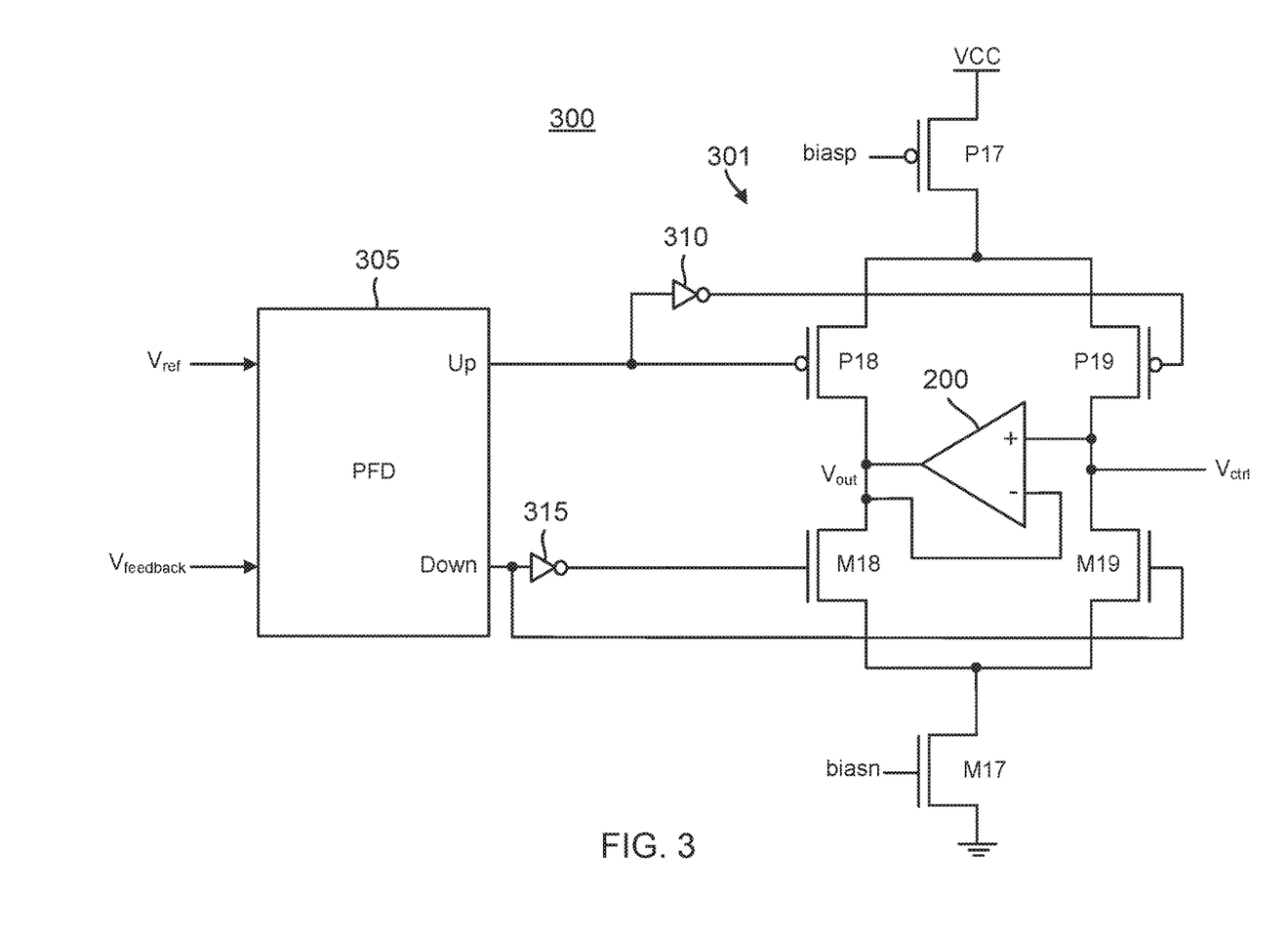
FIG. 3 illustrates the integration of the wide-swing sense amplifier of FIGS. 2A and 2B in a PLL.

The wide swing yet low power operation of sense amplifier 200 reduces charge sharing in PLL applications. An example portion of a PLL 300 is shown in FIG. 3. A phase detector (PFD) 305 compares a reference clock signal Vref to a divided feedback signal Vfeedback. Should the divided feedback signal be lagging the reference clock, PFD 305 asserts an up signal. Conversely, PFD 305 asserts a down signal should the reference clock signal be lagging the divided feedback signal. A charge pump 301 responds to the assertion of the up signal or the down signal to either charge or discharge a control voltage (Vctrl) accordingly. The up signal is inverted in an inverter 310 to drive a gate of a PMOS switch transistor P19. The source of transistor P19 is biased by the drain current of a PMOS current source transistor P17 having its gate biased by a bias voltage biasp. The control voltage is produced at the drain of switch transistor P19. This control voltage is the charge pump output voltage. PLL 300 includes a loop filter (not illustrated) that filters the control voltage to produce a filtered control voltage for controlling the output frequency of a PLL output signal produced by a voltage-controlled oscillator (not illustrated). A feedback divider (not illustrated) divides the PLL output signal to produce the divided feedback signal.

The down signal drives a gate of an NMOS switch transistor M19 having its drain tied to the drain of switch transistor P19. An NMOS current source transistor M17 biased by a bias voltage biasn biases the source of transistor M19. Charge pump 301 also includes a PMOS duplicate switch transistor P18 and an NMOS duplicate transistor M18 arranged in series between the drains of current source transistors P17 and M17. The up signal drives the gate of duplicate switch transistor P18 whereas an inverter 315 inverts the down signal to drive the gate of duplicate switch transistor M18. As discussed previously, duplicate switch transistors P18 and M18 in combination with switch transistors P19 and M19 keep the drains for the current source transistors P17 and M17 charged to the control voltage to prevent charge sharing from affecting the PLL operation. In particular, feedback through sense amplifier 200 keeps the drain voltages (Vout) for duplicate switch transistors P18 and M18 equal to the control voltage (Vctl) drain voltages of transistors M19 and P19 to prevent charge sharing from affecting the control voltage.

Figure 4:
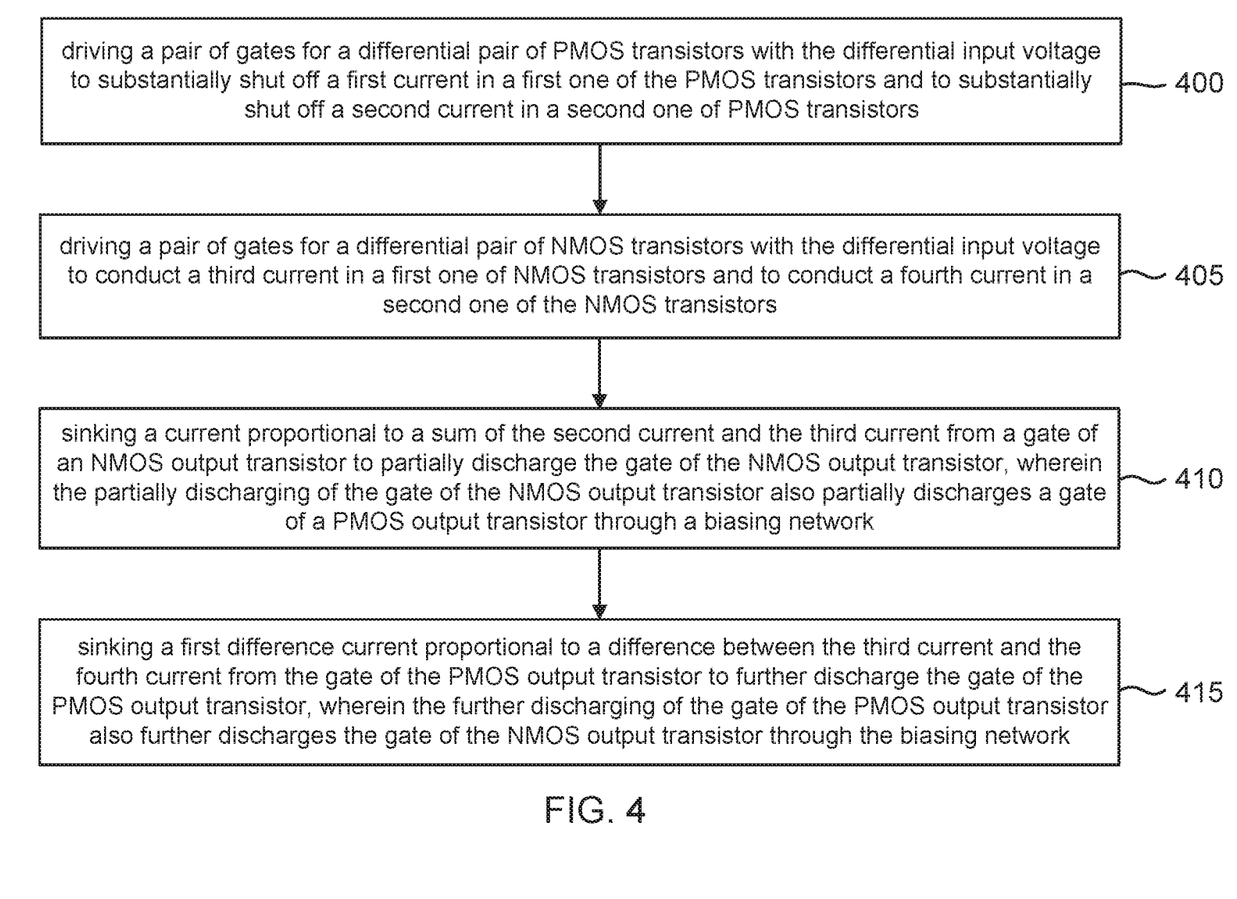
FIG. 4 is a flowchart for a method of operation for a wide-swing sense amplifier in accordance with an aspect of the disclosure.

A method of operation for a sense amplifier will now be discussed with regard to the flowchart of FIG. 5. The method is directed to the driving of the sense amplifier while a common mode voltage for a differential input voltage is greater than a first threshold voltage and includes an act 500 of driving a pair of gates for a differential pair of PMOS transistors with the differential input voltage to substantially shut off a first current in a first one of the PMOS transistors and to substantially shut off a second current in a second one of PMOS transistors. The switching off of transistors P1 and P2 in response to a sufficiently high common mode for the differential input voltage is an example of act 500. The method also includes an act 505 of driving a pair of gates for a differential pair of NMOS transistors with the differential input voltage to conduct a third current in a first one of NMOS transistors and to conduct a fourth current in a second one of the NMOS transistors. The conducting of currents I1 and I2 as discussed with regard to transistors M1 and M2 is an example of act 505. The method further includes an act 510 of sinking a current proportional to a sum of the second current and the third current from a gate of an NMOS output transistor to partially discharge the gate of the NMOS output transistor and to also partially discharge a gate of a PMOS output transistor through a biasing network. The mirroring of the sum current I4 through diode-connected transistor M6 and transistor M8 to sink the mirrored sum current from the ngate node is an example of act 510. Finally, the method includes an act 515 of sinking a difference current proportional to a difference between the third current and the fourth current from the gate of the PMOS output transistor to further discharge the gate of the PMOS output transistor, wherein the further discharging of the gate of the PMOS output transistor also further discharges the gate of the NMOS output transistor through the biasing network. The discharging of the pgate drive voltage by first current differential amplifier 220 is an example of act 515.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A sense amplifier, comprising:
a p-channel metal-oxide semiconductor (PMOS) differential pair of transistors configured to respond to a differential input voltage;
an n-channel metal-oxide semiconductor (NMOS) differential pair of transistors configured to respond to the differential input voltage;
an output stage including a PMOS output transistor and an NMOS output transistor;
a first current differential amplifier configured to sink a first difference current proportional to a difference between a first current for a first NMOS transistor in the NMOS differential pair of transistors and a second current for a second NMOS transistor in the NMOS differential pair of transistors to discharge a gate voltage for the PMOS output transistor;
a biasing network configured to discharge the gate voltage for the NMOS output transistor responsive to a sum of the first current and a third current in a first PMOS transistor in the PMOS differential pair of transistors;
a first NMOS switch transistor and
a second NMOS switch transistor wherein the differential input voltage is coupled across a pair of gates for the first NMOS switch transistor and the second NMOS switch transistor, and wherein the first NMOS switch transistor and the second NMOS switch transistor are coupled in parallel between the first current differential amplifier and the gate of the PMOS output transistor.

2. The sense amplifier of claim 1, further comprising:
a second current differential amplifier configured to source a second difference current proportional to a difference between a fourth current for a second PMOS transistor in the PMOS differential pair of transistors and the third current to charge a gate for the NMOS output transistor, wherein the biasing network is further configured to charge the gate of the PMOS output transistor responsive to a sum of the fourth current and the second current.

3. The sense amplifier of claim 2, further comprising:
a first PMOS switch transistor; and
a second PMOS switch transistor, wherein the first PMOS switch transistor and the second PMOS switch transistor are configured to respond to the differential input voltage, and wherein the first PMOS switch transistor and the second PMOS switch transistor are coupled in parallel between the second current differential amplifier and the gate of the NMOS output transistor.

4. The sense amplifier of claim 1, further comprising:
a first current source configured to bias a pair of source terminals for the PMOS differential pair of transistors; and
a second current source configured to bias a pair of source terminals for the NMOS differential pair of transistors.

5. The sense amplifier of claim 2, wherein a positive half of the differential input voltage is a control voltage for a loop filter in a phase-locked loop (PLL), and wherein a negative half of the differential input voltage is a drain voltage for a transistor in a charge pump for the PLL.

6. The sense amplifier of claim 5, wherein a gate for the first NMOS transistor and a gate for the second PMOS transistor are both coupled to a node carrying the control voltage, and wherein a gate for the second NMOS transistor and a gate for the first PMOS transistor are both coupled to a drain for the transistor in the charge pump for the PLL.

7. The sense amplifier of claim 1, wherein the first differential current amplifier is configured to amplify the first difference current.

8. The sense amplifier of claim 2, wherein the second differential current amplifier is configured to amplify the second difference current.

9. A sense amplifier, comprising:
a p-channel metal-oxide semiconductor (PMOS) differential pair of transistors configured to respond to a differential input voltage;
an n-channel metal-oxide semiconductor (NMOS) differential pair of transistors configured to respond to the differential input voltage;
an output stage including a PMOS output transistor and an NMOS output transistor;
a first current differential amplifier configured to sink a first difference current proportional to a difference between a first current for a first NMOS transistor in the NMOS differential pair of transistors and a second current for a second NMOS transistor in the NMOS differential pair of transistors to discharge a gate voltage for the PMOS output transistor; and a biasing network configured to discharge the gate voltage for the NMOS output transistor responsive to a sum of the first current and a third current in a first PMOS transistor in the PMOS differential pair of transistors, wherein the biasing network comprises a first bias NMOS transistor and a second bias PMOS transistor coupled in parallel between a gate of the PMOS output transistor and a gate of the NMOS output transistor.

10. The sense amplifier of claim 9, wherein a gate for the first bias NMOS transistor is configured to receive a first bias voltage and a wherein a gate of the second bias PMOS transistor is configured to receive a second bias voltage.

11. A method of driving an output voltage from a sense amplifier, comprising:

while a common mode voltage for a differential input voltage is above a first threshold voltage:

driving a pair of gates for a differential pair of p-channel metal-oxide semiconductor (PMOS) transistors with the differential input voltage to substantially shut off a first current in a first one of the PMOS transistors and to substantially shut off a second current in a second one of PMOS transistors;

driving a pair of gates for a differential pair of n-channel metal-oxide semiconductor (NMOS) transistors with the differential input voltage to conduct a third current in a first one of NMOS transistors and to conduct a fourth current in a second one of the NMOS transistors;

sinking a current proportional to a sum of the second current and the third current from a gate of an NMOS output transistor to partially discharge the gate of the NMOS output transistor, wherein the partially discharging of the gate of the NMOS output transistor also partially discharges a gate of a PMOS output transistor through a biasing network;

sinking a first difference current proportional to a difference between the third current and the fourth current from the gate of the PMOS output transistor to further discharge the gate of the PMOS output transistor, wherein the further discharging of the gate of the PMOS output transistor also further discharges the gate of the NMOS output transistor through the biasing network; and while the common mode voltage for a differential input voltage is below a second threshold:

driving the pair of gates for the differential pair of PMOS transistors with the differential input voltage to conduct the first current in the first one of the PMOS transistors and to conduct the second current in the second one of PMOS transistors;

driving the pair of gates for a differential pair of NMOS transistors with the differential input voltage to substantially shut off the third current in the first one of NMOS transistors and to substantially shut off the fourth current in the second one of the NMOS transistors;

sourcing a current proportional to a sum of the first current and the fourth current into the gate of the PMOS output transistor to charge the gate of the PMOS output transistor towards the supply voltage, wherein the charging of the gate of the PMOS output transistor also charges the gate of the NMOS output transistor towards the supply voltage through the biasing network; and sourcing a second difference current proportional to a difference between the first current and the second current to the gate of the NMOS output transistor to further charge the gate of the NMOS output transistor, wherein the further charging of the gate of the NMOS output transistor also further charges the gate of the PMOS output transistor through the biasing network.

12. The method of claim 11, further comprising:
switching on a first pair of switch transistors to sink the first difference current from the gate of the PMOS output transistor.

13. The method of claim 11, further comprising:
switching on a second pair of switch transistors to source the second difference current to the gate of the NMOS output transistor.

14. The method of claim 11, wherein the first difference current is a multiple of the difference between the third current and the fourth current.

15. A sense amplifier, comprising:
a p-channel metal-oxide semiconductor (PMOS) differential pair of transistors configured to respond to a differential input voltage;

an n-channel metal-oxide semiconductor (NMOS) differential pair of transistors configured to respond to the differential input voltage;

an output stage including a PMOS output transistor and an NMOS output transistor;

a first current differential amplifier configured to sink a first difference current proportional to a difference between a first current for a first NMOS transistor in the NMOS differential pair of transistors and a second current for a second NMOS transistor in the NMOS differential pair of transistor to discharge a gate voltage for the PMOS output transistor;

means for biasing the gate voltage for the NMOS output transistor responsive to a sum of the first current and a third current in a first PMOS transistor in the PMOS differential pair and for biasing a gate voltage for the PMOS output transistor responsive to a sum of a fourth current in a second PMOS transistor in the PMOS differential pair and the second current; and a second current differential amplifier configured to source a second difference current proportional to a difference between the fourth current and the third current to charge the gate voltage for the NMOS output transistor.

16. The sense amplifier of claim 15, wherein the sense amplifier is integrated within a charge pump to mitigate charge sharing for a phase-locked loop.

17. The sense amplifier of claim 15, further comprising:
a first current source configured to bias a pair of source terminals for the PMOS differential pair of transistors; and
a second current source configured to bias a pair of source terminals for the NMOS differential pair of transistors.

* * * * *